US007177183B2

(12) United States Patent
Scheuerlein et al.

(10) Patent No.: US 7,177,183 B2
(45) Date of Patent: Feb. 13, 2007

(54) MULTIPLE TWIN CELL NON-VOLATILE MEMORY ARRAY AND LOGIC BLOCK STRUCTURE AND METHOD THEREFOR

(75) Inventors: Roy E. Scheuerlein, Cupertino, CA (US); Luca Fasoli, San Jose, CA (US); Mark G. Johnson, Los Altos, CA (US)

(73) Assignee: SanDisk 3D LLC, Milpitas, CA (US)

( * ) Notice: Subject to any disclaimer, the term of this patent is extended or adjusted under 35 U.S.C. 154(b) by 32 days.

(21) Appl. No.: 10/675,212

(22) Filed: Sep. 30, 2003

(65) Prior Publication Data
US 2005/0078514 A1 Apr. 14, 2005

(51) Int. Cl.
*G11C 16/04* (2006.01)

(52) U.S. Cl. ............................ 365/185.02; 365/185.11; 365/185.21

(58) Field of Classification Search ........... 365/185.05, 365/185.11, 185.21, 158, 209, 225.7
See application file for complete search history.

(56) References Cited

U.S. PATENT DOCUMENTS

| 3,576,549 | A | 4/1971 | Hess et al. |
|---|---|---|---|
| 3,582,908 | A | 6/1971 | Koo et al. |
| 3,634,929 | A | 1/1972 | Yoshida et al. |
| 3,671,948 | A | 6/1972 | Cassen et al. |
| 3,717,852 | A | 2/1973 | Abbas et al. |
| 3,728,695 | A | 4/1973 | Frohman-Bentchkowsky |
| 3,787,822 | A | 1/1974 | Rioult |
| 3,863,231 | A | 1/1975 | Taylor |

(Continued)

FOREIGN PATENT DOCUMENTS

EP 0 626 726 A2 11/1994

(Continued)

OTHER PUBLICATIONS

Crowley et al., "512Mb PROM with 8 Layers of Antifuse/Diode Cells", 2003 IEEE ISSCC Conference, Session 16, Non-Volatile Memory, Paper 16.4, pp. 1-3, and corresponding presentation slides (23 pages).

(Continued)

*Primary Examiner*—Hoai V. Ho
(74) *Attorney, Agent, or Firm*—Zagorin O'Brien Graham LLP

(57) ABSTRACT

Extremely dense memory cell structures provide for new array structures useful for implementing memory and logic functions. An exemplary non-volatile memory array includes a first plurality of X-lines configured to be logically identical in a read mode of operation, and each associated with a first Y-line group numbering at least one Y-line. Each of the first plurality of X-lines may also be associated with a second Y-line group numbering at least one Y-line. In some embodiments, the first and second Y-Line groups are simultaneously selectable in a read mode and, when so selected, are respectively coupled to true and complement inputs of a sense amplifier circuit. Such Y-line groups may number only one Y-line, or may number more than one Y-line. Many types of memory cells may be used, such as various passive element cells and EEPROM cells, in both 2D or 3D memory arrays. Such arrays may be configured as a memory to store data, or configured to perform threshold logic, or configured as a content addressable memory array.

53 Claims, 9 Drawing Sheets

U.S. PATENT DOCUMENTS

| | | |
|---|---|---|
| 3,990,098 A | 11/1976 | Mastrangelo |
| 4,146,902 A | 3/1979 | Tanimoto et al. |
| 4,203,123 A | 5/1980 | Shanks |
| 4,203,158 A | 5/1980 | Frohman-Bentchkowsky et al. |
| 4,229,757 A | 10/1980 | Moussie |
| 4,272,880 A | 6/1981 | Pashley |
| 4,281,397 A | 7/1981 | Neal et al. |
| 4,419,741 A | 12/1983 | Stewart et al. |
| 4,420,766 A | 12/1983 | Kasten |
| 4,442,507 A | 4/1984 | Roesner |
| 4,488,262 A | 12/1984 | Basire et al. |
| 4,489,478 A | 12/1984 | Sakurai |
| 4,494,135 A | 1/1985 | Moussie |
| 4,498,226 A | 2/1985 | Inoue et al. |
| 4,499,557 A | 2/1985 | Holmberg et al. |
| 4,507,757 A | 3/1985 | McElroy |
| 4,543,594 A | 9/1985 | Mohsen et al. |
| 4,569,121 A | 2/1986 | Lim et al. |
| 4,597,162 A | 7/1986 | Johnson et al. |
| 4,646,266 A | 2/1987 | Ovshinsky et al. |
| 4,739,497 A | 4/1988 | Itoh et al. |
| 4,809,231 A | 2/1989 | Shannon et al. |
| 4,820,657 A | 4/1989 | Hughes et al. |
| 4,823,181 A | 4/1989 | Mohsen et al. |
| 4,868,616 A | 9/1989 | Johnson et al. |
| 4,876,220 A | 10/1989 | Mohsen et al. |
| 4,881,114 A | 11/1989 | Mohsen et al. |
| 4,899,205 A | 2/1990 | Hamdy et al. |
| 4,922,319 A | 5/1990 | Fukushima |
| 4,943,538 A | 7/1990 | Mohsen et al. |
| 5,070,383 A | 12/1991 | Sinar et al. |
| 5,070,384 A | 12/1991 | McCollum et al. |
| 5,126,290 A | 6/1992 | Lowrey et al. |
| 5,233,206 A | 8/1993 | Lee et al. |
| 5,306,935 A | 4/1994 | Esquivel et al. |
| 5,311,039 A | 5/1994 | Kimura et al. |
| 5,334,880 A | 8/1994 | Abadeer et al. |
| 5,337,281 A * | 8/1994 | Kobayashi et al. |
| 5,367,207 A | 11/1994 | Goetting et al. |
| 5,391,518 A | 2/1995 | Bhushan |
| 5,427,979 A | 6/1995 | Chang |
| 5,441,907 A | 8/1995 | Sung et al. |
| 5,463,244 A | 10/1995 | De Araujo et al. |
| 5,535,156 A | 7/1996 | Levy et al. |
| 5,536,968 A | 7/1996 | Crafts et al. |
| 5,568,421 A | 10/1996 | Aritome |
| 5,587,944 A | 12/1996 | Shen et al. |
| 5,608,670 A | 3/1997 | Akaogi et al. |
| 5,621,683 A | 4/1997 | Young |
| 5,640,343 A | 6/1997 | Gallagher et al. |
| 5,675,547 A | 10/1997 | Koga |
| 5,726,484 A | 3/1998 | Hart et al. |
| 5,737,259 A | 4/1998 | Chang |
| 5,745,407 A | 4/1998 | Levy et al. |
| 5,751,012 A | 5/1998 | Wolstenholme et al. |
| 5,776,810 A | 7/1998 | Guterman et al. |
| 5,793,675 A | 8/1998 | Cappelletti et al. |
| 5,793,697 A | 8/1998 | Scheuerlein |
| 5,818,748 A | 10/1998 | Bertin et al. |
| 5,818,749 A | 10/1998 | Harshfield |
| 5,835,396 A | 11/1998 | Zhang |
| 5,883,409 A | 3/1999 | Guterman et al. |
| 5,926,415 A | 7/1999 | Shin |
| 5,946,241 A * | 8/1999 | Zink et al. ............. 365/185.13 |
| 5,953,249 A | 9/1999 | Van der Wagt |
| 5,986,937 A * | 11/1999 | Yero ..................... 365/185.21 |
| 5,991,193 A | 11/1999 | Gallagher et al. |
| 6,005,270 A | 12/1999 | Noguchi |
| 6,034,882 A | 3/2000 | Johnson et al. |
| 6,055,180 A | 4/2000 | Gudesen et al. |
| 6,097,626 A | 8/2000 | Brug et al. |
| 6,130,835 A | 10/2000 | Scheuerlein |
| 6,163,048 A | 12/2000 | Hirose et al. |
| 6,185,122 B1 | 2/2001 | Johnson et al. |
| 6,240,046 B1 | 5/2001 | Proebsting |
| 6,243,287 B1 | 6/2001 | Naffziger et al. |
| 6,262,699 B1 | 7/2001 | Suzuki et al. |
| 6,278,711 B1 | 8/2001 | Ganmukhi et al. |
| 6,291,836 B1 | 9/2001 | Kramer et al. |
| 6,363,000 B2 | 3/2002 | Perner et al. |
| 6,407,953 B1 | 6/2002 | Cleeves |
| 6,420,215 B1 | 7/2002 | Knall et al. |
| 6,504,753 B1 | 1/2003 | Scheuerlein et al. |
| 6,515,888 B2 | 2/2003 | Johnson et al. |
| 6,515,904 B2 | 2/2003 | Moore et al. |
| 6,522,594 B1 | 2/2003 | Scheuerlein |
| 6,525,949 B1 | 2/2003 | Johnson et al. |
| 6,545,898 B1 * | 4/2003 | Scheuerlein .................. 365/94 |
| 6,567,287 B2 | 5/2003 | Scheuerlein |
| 6,574,145 B2 | 6/2003 | Kleveland et al. |
| 6,584,006 B2 | 6/2003 | Viehmann |
| 6,611,453 B2 | 8/2003 | Ning |
| 6,618,295 B2 | 9/2003 | Scheuerlein |
| 6,631,085 B2 | 10/2003 | Kleveland et al. |
| 6,646,912 B2 * | 11/2003 | Hurst et al. .................. 365/175 |
| 6,664,639 B2 | 12/2003 | Cleeves |
| 6,738,286 B2 * | 5/2004 | La Rosa ................. 365/185.01 |
| 6,741,509 B2 * | 5/2004 | Kato et al. .................... 365/200 |
| 6,856,572 B2 | 2/2005 | Scheuerlein et al. |
| 6,859,410 B2 | 2/2005 | Scheuerlein et al. |
| 6,888,750 B2 * | 5/2005 | Walker et al. ......... 365/185.05 |
| 2002/0028541 A1 | 3/2002 | Lee et al. |
| 2003/0161197 A1 * | 8/2003 | Iwata et al. .................. 365/200 |
| 2004/0100852 A1 * | 5/2004 | Scheuerlein et al. ... 365/230.06 |

FOREIGN PATENT DOCUMENTS

WO    WO 97/47041    12/1997

OTHER PUBLICATIONS

De Graaf, C. et al., "A Novel High-Density Low-Cost Diode Programmable Read Only Memory," 1996 IEEE, IEDM Technical Digest, San Francisco, CA, Dec. 8-11, 1996, pp. 189-192.

Evans, Robert J. et al., "Energy Consumption Modeling and Optimization for SRAM's," IEEE Journal of Solid-State Circuits, vol. 30, No. 5, May 1995, pp. 571-579.

Greene, Jonathan et al., "Antifuse Field Programmable Gate Arrays," Proceedings of the IEEE, vol. 81, No. 7, New York, Jul. 1993, pp. 1042-1056.

Hardee, Kim C. and Rahul Sud, "A Fault-Tolerant 30 ns/375 mW 16K×1 NMOS Static RAM,"IEEE Journal of Solid-State Circuits, vol. SC-16, No. 5, Oct. 1981, pp. 435-443.

Naji, Peter K. et al., "A 256kb 3.0V ITIMTJ Nonvolatile Magnetoresistive RAM," 2001 IEEE ISSCC, Feb. 6, 2001, Paper 7.6, and corresponding presentation slides (35 pages).

Nishihara, Toshiyuki et al., "A Quasi-Matrix Ferroelectric Memory for Future Silicon Storage," IEEE Journal of Solid-State Circuits, vol. 37, No. 11, Nov. 2002, pp. 1479-1484.

Sugibayashi, Tadahiko et al., "A 30-ns 256-Mb DRAM with a Multidivided Array Structure," IEEE Journal of Solid-State Circuits, vol. 28, No. 11, Nov. 1993, pp. 1092-1098.

Takeuchi, Ken et al., "A Negative $V_{th}$ Cell Architecture for Highly Scalable, Excellently Noise-Immune, and Highly Reliable NAND Flash Memories," IEEE Journal of Solid-State Circuits, vol. 34, No. 5, May 1999, pp. 675-684.

Wada, Toshio et al., "A 15-ns 1024-Bit Fully Static MOS RAM," IEEE Journal of Solid-State Circuits, vol. SC-13, No. 5, Oct. 1978, pp. 635-639.

* cited by examiner

TWIN CELL

BINARY DECISION WITH REFERENCE

MULTIPLE TWIN CELL NON-VOLATILE MEMORY ARRAY AND LOGIC BLOCK STRUCTURE AND METHOD THEREFOR

BACKGROUND

The present invention relates to non-volatile memory array structures, and in preferred embodiments, particularly relates to those suitable for implementation of both memory and logic block structures.

Ongoing developments in semiconductor processing technologies and memory cell technologies continue to increase the density achieved in integrated circuit memory arrays. For example, certain passive element memory cell arrays may be fabricated having word lines approaching the minimum feature size (F) and minimum feature spacing for the particular word line interconnect layer, and also having bit lines approaching the minimum feature width and minimum feature spacing for the particular bit line interconnect layer. Moreover, three-dimensional memory arrays having more than one plane or level of memory cells have been fabricated implementing such so-called $4F^2$ memory cells on each memory plane. Exemplary three-dimensional memory arrays are described in U.S. Pat. No. 6,034,882 to Johnson, entitled "Vertically Stacked Field Programmable Nonvolatile Memory and Method of Fabrication," and in U.S. Pat. No. 5,835,396 to Zhang, entitled "Three-Dimensional Read-Only Memory."

A variety of other memory cell technologies and arrangements are also known. For example, NAND flash and NROM flash EEPROM memory arrays are also known to achieve relatively small memory cells. Other small flash EEPROM cells are known which use hot electron programming, such as NROM and floating gate NOR flash memory arrays. Such memory cells may also be desirable for a 3D memory array, although they frequently use many masks to produce a memory layer, and some use relatively high programming currents. Moreover, Ferro-electric (FeRAM) memory arrays are also known to produce relatively small memory cells.

SUMMARY

The availability of extremely dense memory cell structures, and particularly those implemented in a three-dimensional memory array, provides an opportunity for new array structures for implementing memory and logic functions.

In an exemplary embodiment, a memory array includes X-lines or word lines, and further includes Y-lines or bit lines, with a memory cell associated at each intersection of a word line and a bit line. Individual memory cells are typically programmed by selecting, during a program mode, a single word line and bit line. During a read mode, however, a group of word lines is simultaneously driven to access a group of memory cells associated with a bit line. Various types of memory cells may be used which, when selected, add to the bit line current, such as passive element cells and EEPROM cells, as well as others. A true bit line and a complement bit line may be simultaneously selected, and coupled to a sense amplifier circuit.

Such a memory array structure may be used to compensate for the failure of a particular memory cell to program, by programming other memory cells along the same bit line and which are associated with the selected word line group. In addition, a virgin bit failure or other similar defect in a memory cell associated with one of the bit lines may be compensated by programming multiple memory cells associated with the complement bit line. Moreover, even if implemented using write-once memory cells, such a memory array may be "re-written" by programming at least one more cell associated with the opposite bit line group than the number of previously programmed memory cells associated with one bit line group. This capability is particularly advantageous for arrays containing trim information or other configuration information that might benefit from the ability to rewrite each location a few times, even when the underlying cell technology is non-erasable.

Memory array structures in accordance with the present invention may be used to implement a variety of logic functions by using multiple program cycles of memory cells on each bit line, thereby adjusting the amount of aggregate memory cell current which flows on the bit line. In various configurations, a non-volatile content addressable memory array may be achieved. In other configurations, an array may be configured to perform threshold logic, and weighted threshold logic.

In some exemplary embodiments of the invention, a non-volatile array includes a first plurality of X-lines configured to be logically identical in a read mode of operation, and each associated with a first Y-line group numbering at least one Y-line. Each of the first plurality of X-lines may also be associated with a second Y-line group numbering at least one Y-line. In some embodiments, the first and second Y-Line groups are simultaneously selectable in a read mode and, when so selected, are respectively coupled to true and complement inputs of a sense amplifier circuit. Such Y-line groups may number only one Y-line, or may number more than one Y-line.

In some embodiments, such as certain ones in which the first and second Y-line groups each numbers more than one Y-line, a reference signal may be operably coupled to either the true or complement input of the sense amplifier circuit. Such a reference signal may comprise a reference current in some embodiments.

In some embodiments, the first Y-line group includes more than one Y-line, and each of the first Y-line group is configured to be logically identical in a read mode of operation. In many embodiments, each of the first plurality of X-lines is configured to be logically independent in a write mode of operation.

A wide variety of memory cells are contemplated for use with the invention. Passive element memory cells, especially anti-fuse memory cells, are particularly contemplated, but magnetoresistive passive element memory cells and EEPROM memory cells are contemplated as well. Moreover, the invention is well suited for use in both two-dimensional arrays and three-dimensional arrays. In embodiments using a three-dimensional array technology, the first plurality of X-lines may be disposed on more than one layer of the array, or may be disposed on a single layer of the array.

The invention in various embodiments may be configured to store data as in a traditional memory arrangement, may be configured to perform threshold logic upon one or more inputs to the array, and may be configured as a content addressable memory array.

The invention in several aspects is suitable for integrated circuits having an array, for cell and array structures, for methods for operating such integrated circuits and array structures, and for computer readable media encodings of such integrated circuits or array structures, all as described herein in greater detail and as set forth in the appended claims.

The foregoing is a summary and thus contains, by necessity, simplifications, generalizations and omissions of detail. Consequently, those skilled in the art will appreciate that the foregoing summary is illustrative only and that it is not intended to be in any way limiting of the invention. Other aspects, inventive features, and advantages of the present invention, as defined solely by the claims, may be apparent from the detailed description set forth below.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
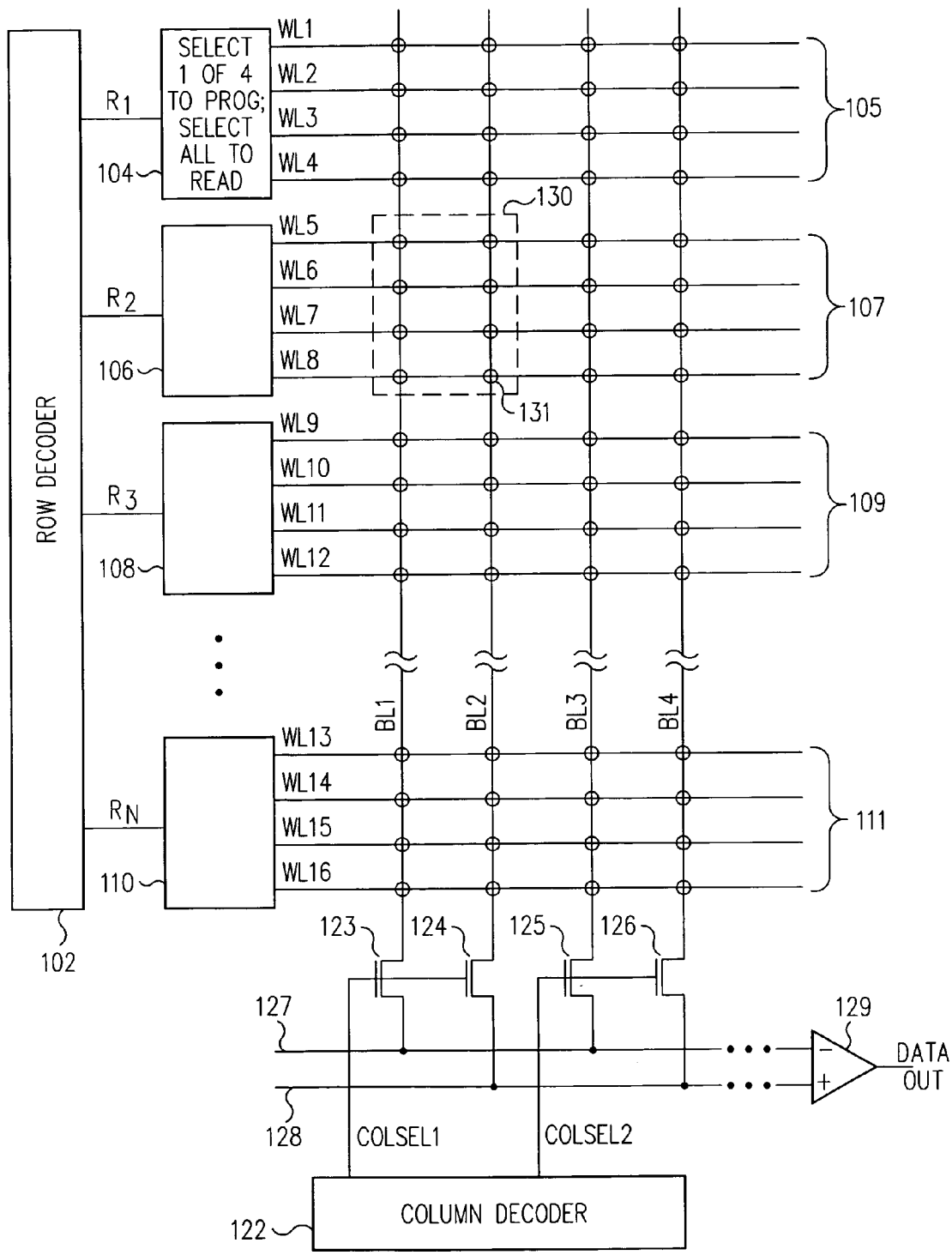
FIG. 1 depicts a non-volatile memory array in accordance with certain embodiments of the present invention, in which individual word lines are selected during programming, but multiple word lines are selected for reading.

Referring to FIG. 1, a non-volatile memory array 100 is depicted in accordance with certain embodiments of the present invention, in which individual word lines are selected during programming, but multiple word lines are selected for reading. The exemplary memory array 100 includes a row decoder 102 for generating a plurality of row select output signals R1, R2, R3, . . . RN, which are respectively conveyed to word line decoders 104, 106, 108, 110. Each word line decoder receives a row select signal and drives four word lines. For example, word line decoder 104 is responsive to row select signal R1 and generates four word lines WL1, WL2, WL3, WL4. During programming, one of the four word lines 105 is selected at any one time (responsive to decode signals not shown), whereas during read mode all four word lines 105 are simultaneously selected in response to R1.

Other groups of word lines (also referred to herein as "X-lines") are also depicted. Word line decoder 106 is responsive to row select signal R2 and generates four word lines WL5, WL6, WL7, WL8 of word line group 107. Word line decoder 108 is responsive to row select signal R3 and generates four word lines WL9, WL10, WL11, WL12 of word line group 109. Lastly, word line decoder 110 is responsive to row select signal RN and generates four word lines WL13, WL14, WL15, WL16 of word line group 111. Each word line decoder is configured, like decoder 104, to select one of its four word lines during programming and select all four of its word lines during read mode. Since row decoder 102 generates one active row select signal, during read only one word line group of four word lines is selected, and during programming only one word line itself is selected.

Two pairs of bit lines (also referred to herein as "Y-lines") are depicted, each being selected by a respective column select signal. Bit lines BL1, BL2 are respectively coupled by select devices 123, 124 to signal buses 127, 128 when selected by a COLSEL1 signal generated by column decoder 122. Similarly, bit lines BL3, BL4 are respectively coupled by select devices 125, 126 to signal buses 127, 128 when selected by a COLSEL2 signal. A data sensing circuit 129 generates a DATAOUT signal based upon the signal coupled to signal buses 127, 128.

In the memory array 100, a memory cell is represented at each intersection of a word line and a bit line. Such memory cells may include 2-terminal passive element memory cells, and may include other programmable memory cells, such as 3-terminal EEPROM cells, as described below in greater detail, although only a single X-line and Y-line is depicted for each memory cell location (i.e., other types of wires for certain memory cell types are not shown).

To understand the operation of this exemplary array, assume that the array includes antifuse passive element memory cells, and that the X-lines are driven and the Y-lines are sensed. Further assume that word lines WL5, WL6, WL7, and WL8 of word line group 107 are selected and that bit lines BL1 and BL2 are selected by COLSEL1. A group of 8 memory cells (labeled as 130) are thus selected during such a read cycle. Four of the selected memory cells are associated with BL1, and the other four memory cells are associated with BL2. To program a logic "1" into the selected group of cells 130 within the array 100, one or more memory cells associated with BL2 are programmed, and no memory cells associated with BL1 are programmed. To read this data, the cell current flowing on bit line BL2 results from one or more programmed cells, while the cell current flowing on bit line BL1 arises just from leakage current through the four unprogrammed cells associated with bit line BL1. To program a logic "0" into the cells 130, one or more memory cells associated with BL1 is programmed, and no memory cells associated with BL2 are programmed. To read this data, the cell current flowing on bit line BL1 results from one or more programmed cells, while the cell current flowing on bit line BL2 is the leakage current through the four unprogrammed cells associated with bit line BL2. No reference signal is required, for the leakage current flowing on one bit line essentially forms the reference signal for the other bit line.

Thus far, similar operation could have been achieved by a twin cell arrangement in which each bit of data is stored in true and complement form in two respective memory cells. However, by configuring the array so that multiple word lines are selected during read mode, numerous advantages may be achieved. For a memory cell technology in which the programmed cell current varies widely, additional cells may be programmed to ensure that a certain minimum "cell current" (actually, an aggregate cell current of the simultaneously selected cells which flows on the bit line) is achieved, even if one or more of the programmed cells has an unusually low value of programmed current. Since no mid-level reference signal is required, the circuit is very resistant to noise, and the available signal is doubled compared to having a reference level corresponding to the midpoint between the programmed and unprogrammed value of cell current. Moreover, by programming up to four memory cells on either the true or complement bit lines, the signal achieved is 8× greater than the worst case signal achieved when using the mid-level reference. This is true for either a stored one or a stored zero.

Figure 3:
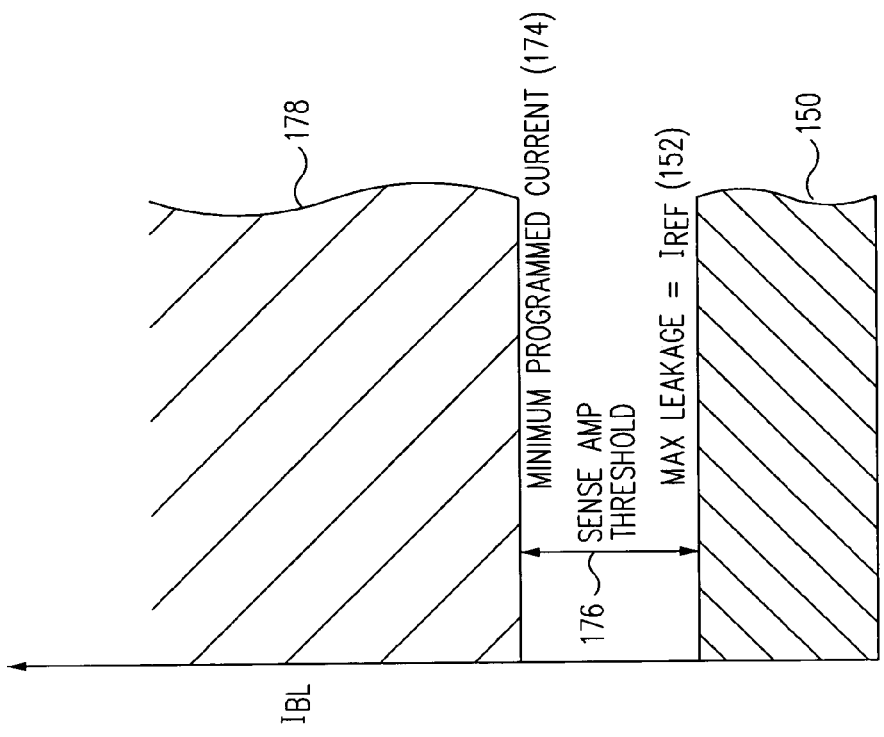
FIG. 3 depicts the bit line current for a multiple twin cell arrangement.
Figure 2:
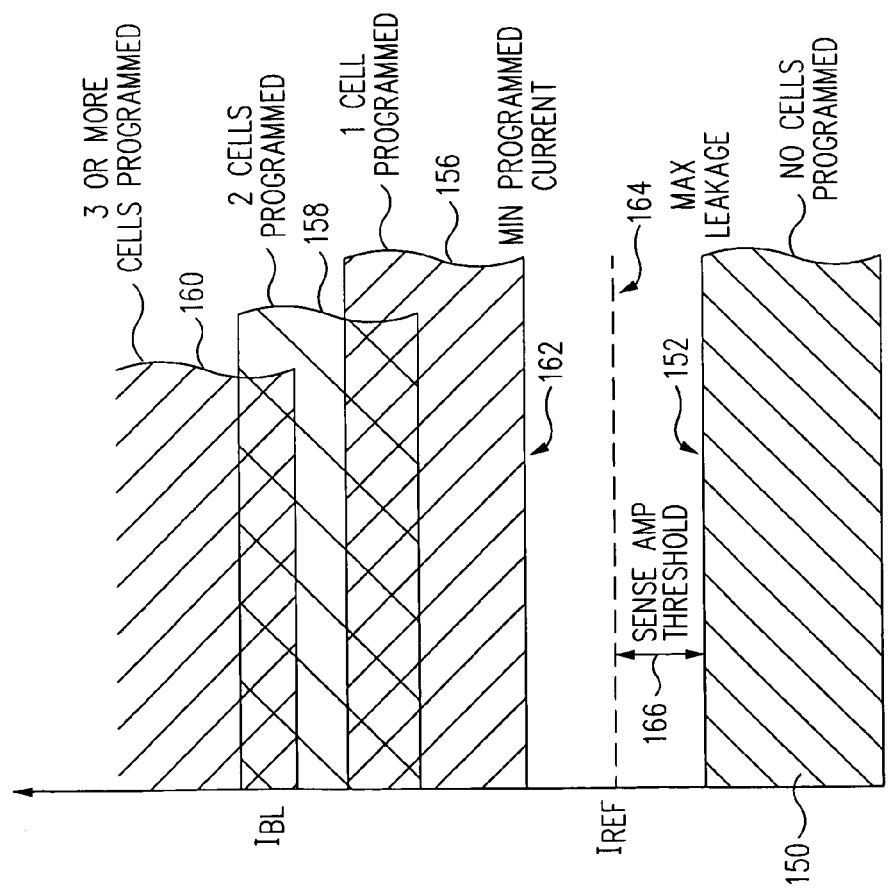
FIG. 2 depicts a graph of bit line current as a function of the number of programmed memory cells which might be simultaneously selected on a bit line group.

This advantage is illustrated in FIG. 2 and FIG. 3. Referring now to FIG. 2, a graph of the bit line current is depicted as a function of the number of programmed memory cells which are simultaneously selected on a bit line. The region 150 corresponds to none of the memory cells being programmed, and the upper limit of this region, labeled as 152, represents the maximum leakage current on the bit line. The region 156 represents the bit line current resulting from one memory cell being programmed, and the lower limit of this range, labeled 162, represents the minimum bit line current. A reference level 164 is traditionally generated at the mid-point between these two levels of current, which allows the bit line current to be compared to the reference level to determine the data state of the cell being read. Accordingly, the sense amplifier threshold has a value set by the difference between the reference level 164 and the maximum leakage level 152 (shown as threshold 166), and also by the difference between the reference level 164 and the minimum programmed current level 162. Also shown in the figure, the region 158 represents the bit line current corresponding to two programmed memory cells, and the region 160 represents the bit line current corresponding to three programmed memory cells. Such additional current cannot be discriminated when the reference level is set as indicated in the figure.

Referring now to FIG. 3, the bit line currents for a multiple twin cell arrangement is depicted. As before, region 150 corresponds to none of the memory cells being programmed, and the upper limit of this region, labeled as 152, represents the maximum leakage current on the bit line. The region 178 may be viewed as representing the bit line current resulting from one memory cell being programmed, and the lower limit of this range, labeled 174, represents the minimum programmed bit line current. Since the bit line current for one bit line is compared to the bit line current for the other bit line, the sense amplifier threshold has a value set by the difference between the minimum programmed current 174 and the maximum leakage level 152, shown as threshold 176. This results in a doubling of the sense amplifier threshold level.

However, when additional memory cells are potentially programmed, the minimum programmed current 174 may increased to a higher value, which increases the sense amplifier threshold even more than the factor of two described above. Assuming each programmed memory cell linearly added to bit line current, programming four such memory cells would result in a sense amplifier threshold which is a factor of eight higher than the sense amplifier threshold 166 shown in FIG. 2. Even assuming some variation in the magnitude of each cell's programmed current, the minimum programmed current 174 may be assured of increasing when more than one memory cell is programmed, with a resultant improvement of the sense amplifier threshold which is achieved. In some embodiments, a read-after-write verification operation may be performed to determine the number of memory cells to program to achieve a desired minimum programmed current on a bit line.

In addition, the arrangement depicted in FIG. 1 is frequently tolerant of a "virgin bit failure," which is an unprogrammed memory cell which nonetheless is conductive (or at least very leaky) due to a manufacturing defect. For example, if memory cell 131 is conductive as manufactured, a logic one can be easily written into the locations 130 by programming one or more additional memory cells associated with BL2, which merely reinforces the current through memory cell 131. However, to program a logic zero, several memory cells associated with BL1 may be programmed, which together generate a greater bit line read current than the leaky cell 131, and thus can be sensed as a logic zero by the sense circuit 129.

Figure 5:
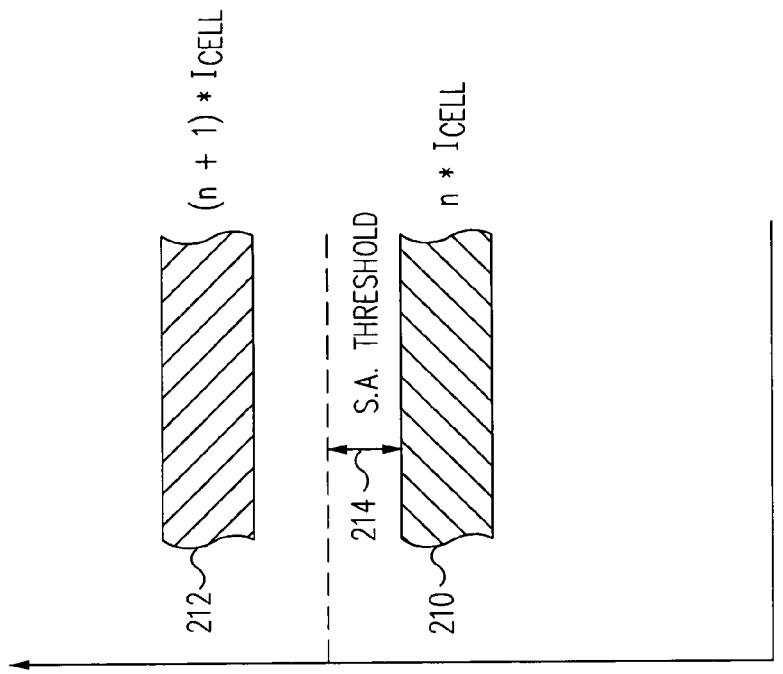
FIG. 5 is a graph showing the spread of bit line current for "n" programmed cells and for "n+1" programmed cells, illustrating the tightening achieved by programming multiple cells.
Figure 4:
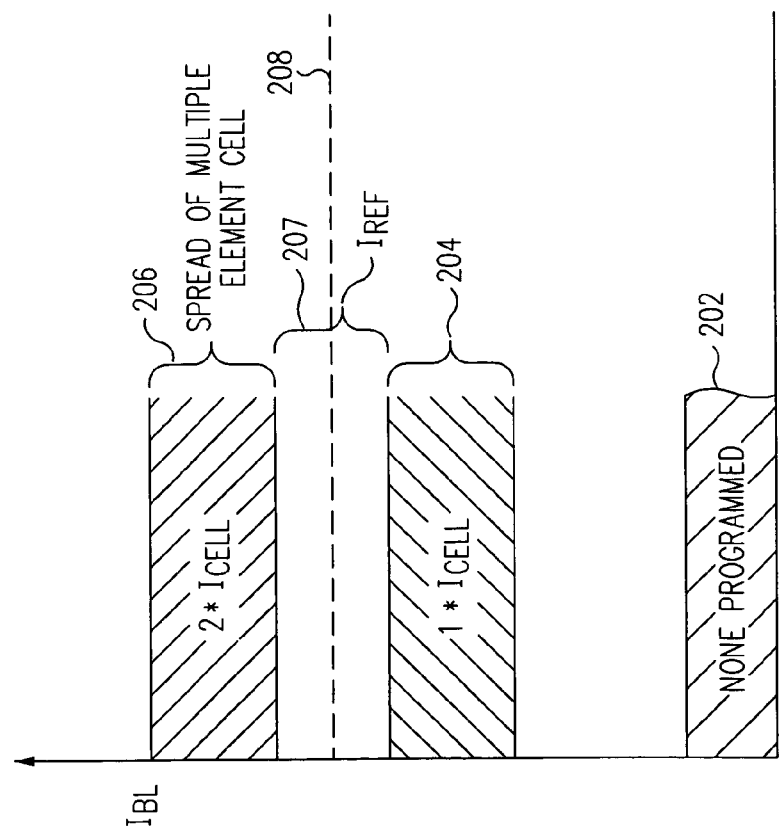
FIG. 4 is a graph showing three levels of programmed current, corresponding to different numbers of programmed cells.

The array structure depicted in FIG. 1 may also be used to store more than one bit of data within the memory cell group 130 rather than just one bit, as described above. Referring now to FIG. 4, a graph is depicted showing three levels of programmed current, corresponding to none programmed (region 202), 1 cell programmed (region 204), and two cells programmed (region 206). By using multiple program cycles (e.g., for some embodiments, on more than one memory cell, and for other embodiments, multiple programming cycles on a single cell), the distribution of programmed currents may be tightened, especially those cells having widely varying programmed currents. In such embodiments, a reference level could be set to a level above the current corresponding to N-cells programmed, and the programming of the cells could be controlled using a feedback scheme to continue programming until the desired level of programmed current is achieved. By tightening the programming spread, the magnitude of the spread can be less than the reference spread $I_{REF}$ between adjacent programmed values, as shown in FIG. 5. The region 210 corresponds to the spread of bit line current for "n" programmed cells, while the region 212 corresponds to the spread of bit line current for "n+1" programmed cells. By increasing the difference between these two spreads 210 and 212, a reference level 208 generated at the mid-point between such spreads will provide a larger sense amplifier threshold value, depicted as 214.

The same general memory array structure as described above may be used as a logic block, rather than as a more typical memory block, to implement threshold logic and weighted input threshold logic. Since this kind of logic block replaces fairly complex logic gates, one can afford to utilize many inexpensive memory cells. As before, such a structure is based on the ability to adjust the strength of an input by virtue of the multiple memory cells that are simultaneously selected during a read mode operation.

Figure 6:
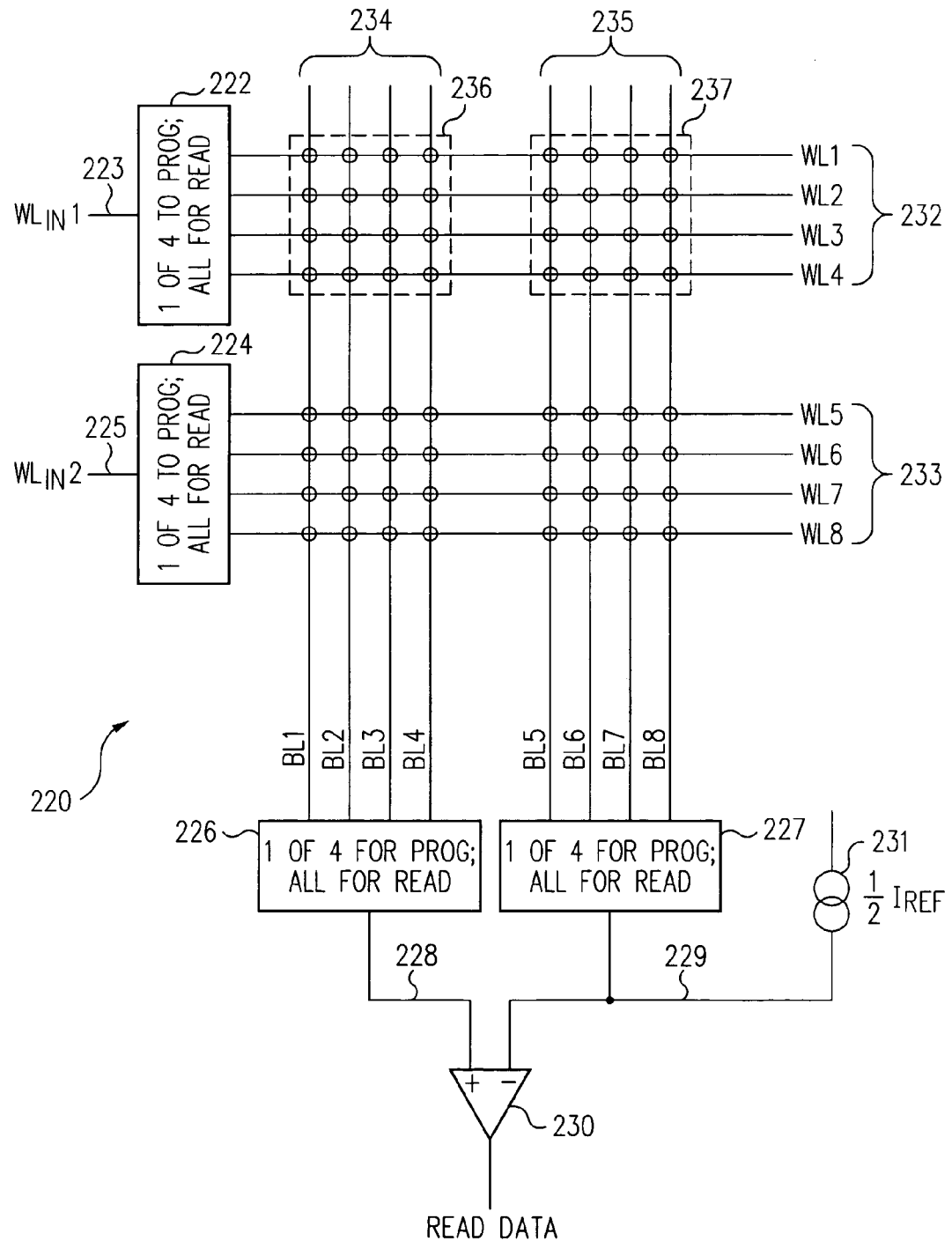
FIG. 6 depicts a memory array structure which includes a respective plurality of bit lines that are-collectively coupled to a respective input of a sense amplifier, where both of the two bit line groups are associated with the selected group of word lines.

In the above examples, a group of word lines are configured as logically identical during a read mode of operation to access a group of memory cells, half of which are associated with a first selected bit line, and the other half associated with a second selected bit line, which two bit lines are respectively coupled to respective inputs of a selected sense amplifier. Referring now to FIG. 6, a memory array structure 220 is depicted which expands this concept to include a respective plurality of bit lines that are collectively coupled to a respective input of a sense amplifier. Both of these two bit line groups are associated with the selected group of word lines, and thus a memory cell is disposed at the intersection of each word line and bit line.

The exemplary memory array 220 includes two input signals WLIN1, WLIN2, such as from a row decoder (not shown), which are respectively conveyed to word line decoders 222, 224. In typical practice it should be understood that many more such word line decoders may be implemented, but for clarity only two are depicted here. Each word line decoder receives an input signal and drives four word lines. Word line decoder 222 generates a group 232 of four word lines WL1, WL2, WL3, WL4. During programming, one of these four word lines 232 is selected at any one time (responsive to decode signals not shown), whereas during read mode all four word lines 232 are simultaneously selected (assuming, of course, that the input signal WLIN1 is selected). Similarly, word line decoder 224 generates a group 233 of four word lines WL5, WL6, WL7, WL8. For the present description, assume that only one input signal WLIN1, WLIN2, is active at any time, and that consequently, only one word line group of four word lines is selected during read mode of operation, and only one word line itself is selected during programming mode.

Two groups 234, 235 of bit lines are depicted. During a read operation, both such bit line groups 234, 235 are simultaneously selected by a respective column select signal (not shown) and coupled to respective inputs of a sense amplifier circuit 230. Bit lines BL1, BL2, BL3, and BL4 are collectively coupled to signal bus 228, and bit lines BL5, BL6, BL7, and BL8 are collectively coupled to signal bus 229. A reference signal is also coupled to the signal bus 229 by a signal generator 231 (e.g., such as a current source). The two signal buses 228, 229 are coupled to respective inputs of the sense amplifier 230, which then generates a read data signal. The sense amplifier 230 may be shared by other non-selected bit line groups (not shown). As with the word line decoders, the bit line decoders 226, 227 select one bit line for programming, but simultaneously select all four bit lines during read. Suitable decoder and programming circuitry may be incorporated depending upon the technology employed in manufacturing the memory array, and no particular advantage is believed afforded by any one circuit form, at least in the context of practicing this invention.

As before, a memory cell is represented at each intersection of a word line and a bit line. Such memory cells may include 2-terminal passive element memory cells, and may include other programmable memory cells, such as 3-terminal EEPROM cells, as described below in greater detail, although only a single X-line and Y-line is depicted for each memory cell location (i.e., other types of wires for certain memory cell types are not shown). Preferably such memory cells are passive element memory cells, and more preferably they are antifuse cells.

As may be appreciated, a single input such as WLIN1 causes four word lines to be selected during a read mode, which drives sixteen memory cells coupled to the non-inverting input of a selected sense amplifier, and which also drives another sixteen memory cells coupled to the inverting input of the selected sense amplifier. The bit line currents on each of the bit lines within bit line group 234 are summed together before sensing, as are the four bit line currents within bit line group 235. As may be appreciated, the strength of a single input may be varied greatly, depending upon how many of the sixteen memory cells in group 236 are programmed, and depending upon how many of the sixteen memory cells in group 237 are programmed. This may be utilized to achieve a tighter distribution of aggregate $I_{CELL}$ current.

The memory array 220, even if implemented using write-once memory cells (e.g., certain anti-fuse memory cells), may be "re-written" by programming at least one more cell associated with one bit line group (e.g., group 236) than the number of previously programmed memory cells associated with the other bit line group (e.g., group 237). For example, the memory location defined by groups 236 and 237 may be initially programmed to a logic "1" state by programming one memory cell within group 236. Later, the memory location may be re-written to a logic "0" by programming two cells within group 237. Even later, the memory location can be re-written back to a logic "1" by programming two more cells within group 236 (for a total of three programmed cells). Alternatively, the number of programmed cells in each step could be larger to increase the sense amplifier threshold. This capability is particularly advantageous for arrays containing trim information or other configuration information that might benefit from the ability to rewrite each location a few times, even when the underlying cell technology is non-erasable.

Figure 7:
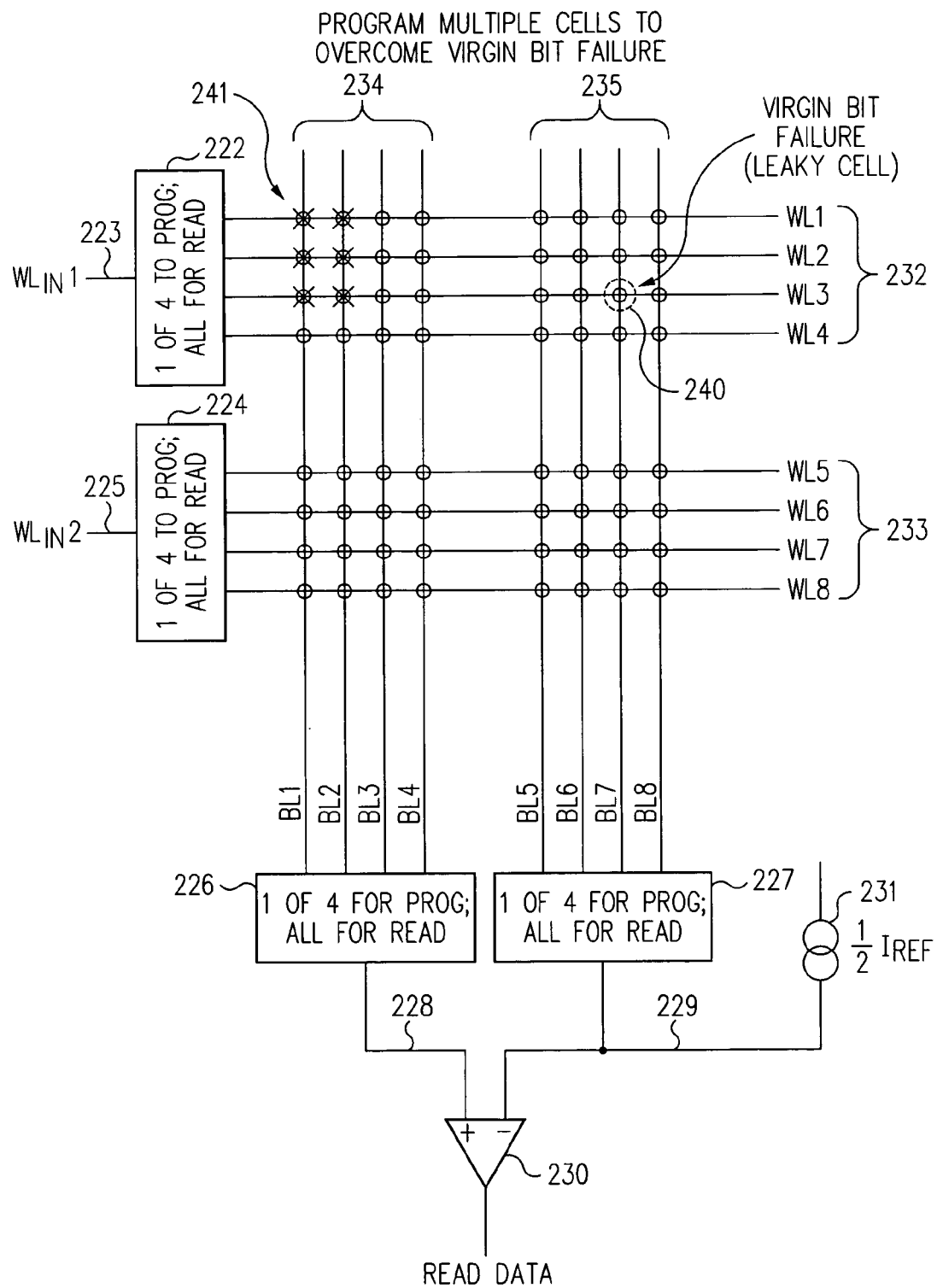
FIG. 7 illustrates an advantageous use of the structure shown in FIG. 6, in which a group of memory cells associated with one bit line group are programmed to compensate for a virgin bit failure which occurs on a memory cell associated with the other bit line group.

The next several figures illustrate several other advantageous uses of such a memory array structure. In FIG. 7, a group of memory cells 241 (e.g., here shown as a group of six such cells) associated with one bit line group 234 are programmed to compensate for a virgin bit failure 240 which occurs on a memory cell associated with the other bit line group 235. The aggregate bit line current flowing in bit line group 234 overcomes the aggregate bit line current resulting from the virgin bit failure 240 which flows in bit line group 235.

Figure 8:
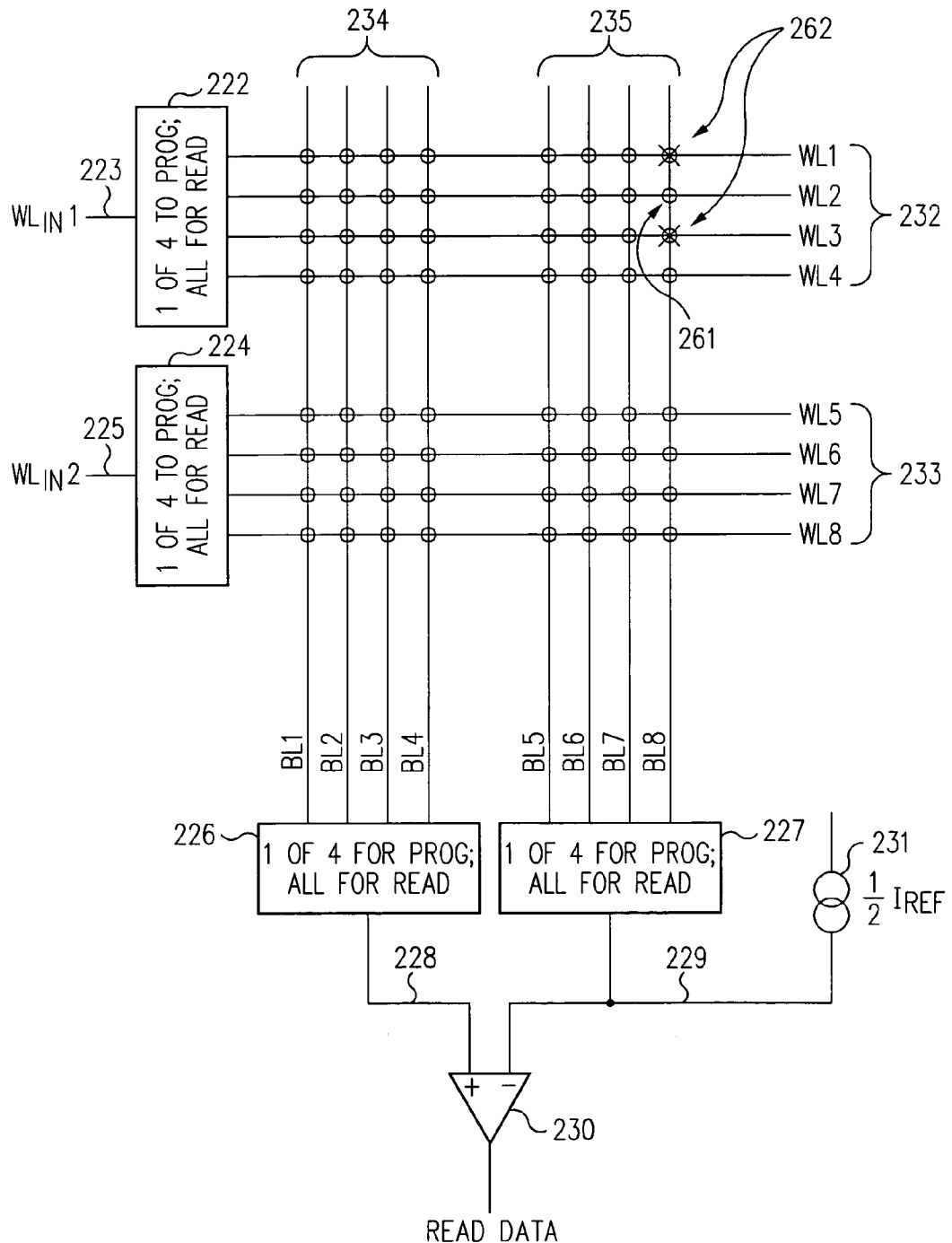
FIG. 8 illustrates an advantageous use of the structure shown in FIG. 6, in which a group of memory cells associated with a bit line group are programmed to compensate for a failure to program another memory cell associated with the same bit line group.

In FIG. 8, a group of memory cells 262 (e.g., here shown as a group of two such cells) associated with bit line group 235 are programmed to compensate for a failure to program cell 261 associated with the same bit line group 235. With sixteen such memory cells associated with both the word line group 232 and the bit line group 235, a wide range of programmed current may be achieved, and may compensate for the failure of one or a few such cells to program.

Figure 9:
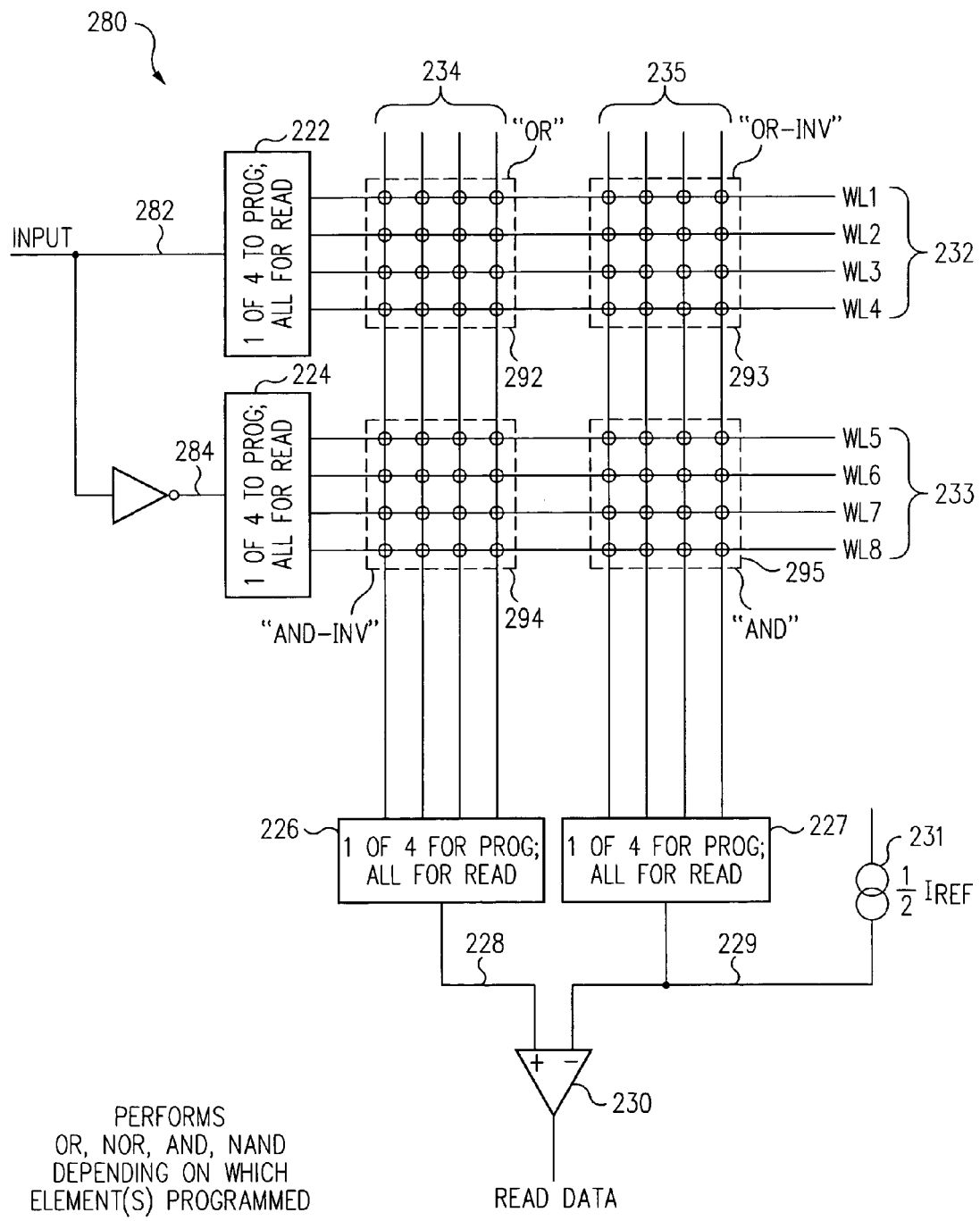
FIG. 9 depicts a memory array structure in which an input to a second word line decoder is a complementary signal relative to an input to a first word line decoder, which structure provides for any of four different logic functions which may be implemented in the array.

In FIG. 9, a memory array structure 280 is depicted which is identical with that shown in FIGS. 6, 7, and 8 except that the input 284 to the second word line decoder 224 is a complementary signal relative to the input 282 to the first word line decoder 222. Consequently, during a read mode the group of logically identical word lines 232 is complementary to the group of logically identical word lines 233. In the figure, a pair of word line decoders is depicted which respectively receive true and complement versions of a single input signal 282. It should be appreciated that in actual practice a number of such complementary pairs of word line decoders may be provided, each associated with a respective input signal, and each associated with at least one group of bit lines. As illustrated in the figure, each bit line group numbers more than one bit line (e.g., here shown as four bit lines in each group), but each such bit line group may number as few as a single bit line.

Each of the four groups of memory cells shown performs a particular logic function of the input 282. Each of the memory cells in group 292 (i.e., the group of sixteen memory cells representing the word line/bit line intersections between word line group 232 and bit line group 234) performs an OR function; while each of the memory cells in group 293 performs a NOR function; each of the memory cells in group 294 performs a NAND function; and each of the memory cells in group 295 performs an AND function. Since there are sixteen memory cells within each of these four groups, the weight of each input may be varied widely by programming a particular number of the memory cells within a group. By including a number logic inputs, complicated weighted logic functions may be implemented in a space efficient manner.

Figure 10:
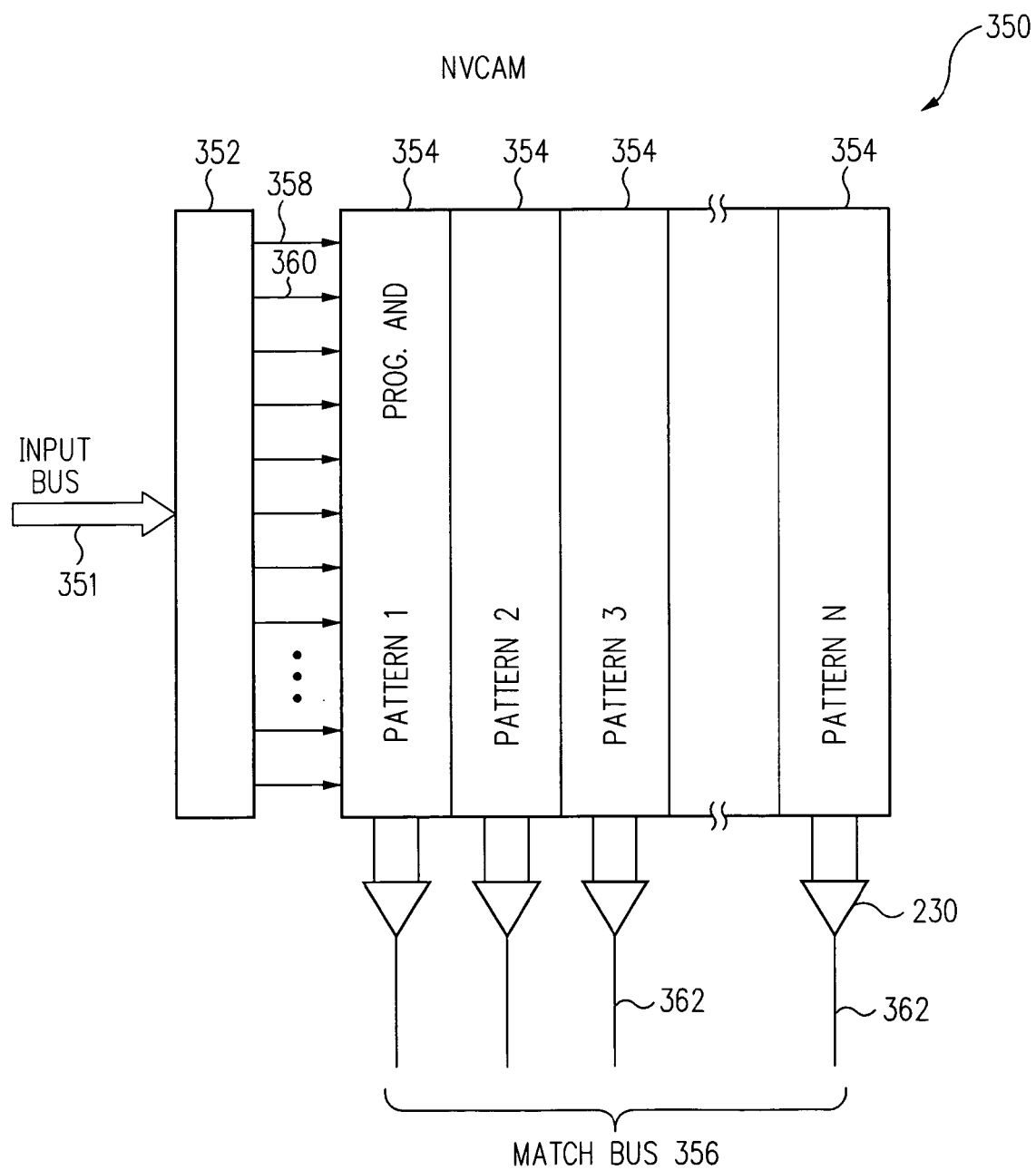
FIG. 10 depicts a non-volatile content addressable memory (NVCAM) implemented using a similar memory array structure.

Such a structure just described may be utilized to implement a non-volatile content-addressable memory array (NV-CAM). Referring now to FIG. 10, a NVCAM 350 is depicted which receives a digital word on an input bus 351 and generates a series of outputs 362 on a match bus 356 for each detected pattern. A programmable AND array 354 is provided for each desired match pattern, and which generally follows the arrangement depicted in FIG. 9. An X-line decoder 352 receives the input data word and generates true and complement versions of each bit position, which are then conveyed to the array blocks 354 as groups of at least one logically identical X-lines associated with each such true and complement signal. Two such groups 358, 360 are depicted.

Figure 11:
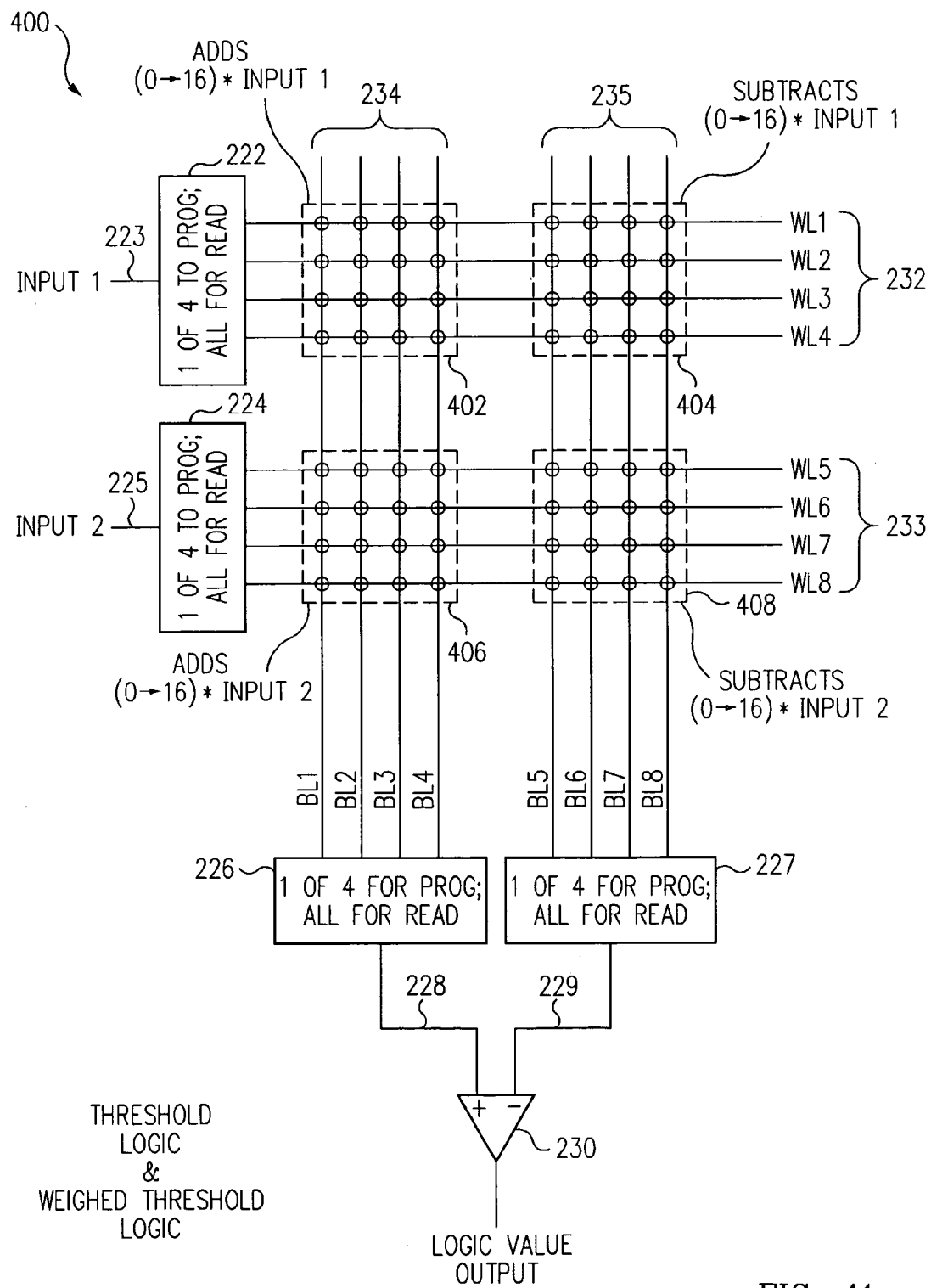
FIG. 11 depicts a memory array which is configured to perform threshold logic and weighted threshold logic, in which the weights are non-volatile and are set by multiple program cycles of many different memory cells.

Referring now to FIG. 11, a memory array 400 is depicted which is configured to perform threshold logic and weighted threshold logic. In this case the weights are non-volatile and are set by multiple program cycles of many different memory cells. The first word line decoder 222 receives a first arbitrary input signal INPUT1 while a second word line decoder 224 receives another arbitrary input signal INPUT2, which would typically be unrelated to INPUT1. As with the other embodiments described herein, only a portion of a memory array expected in practice is depicted in the figure and described herein, as many instantiations of such word line decoders would be anticipated, each associated with a respective one of a much larger of logic input signals.

In operation, the logic value output which is generated by sense amplifier 230 is a weighted function of each input which is either added to, or subtracted from, an accumulated total for the bit line groups 234 and 235. For example, each programmed memory cell within the memory cell group 402 incrementally adds bit line current to the aggregated signal on bit line group 234. Depending upon the number of memory cells so programmed, a factor of from 0 to 16 times the logic signal INPUT1 may be added to the bit line group 234 aggregate current. Since this bit line group 234 is coupled to the non-inverting input of sense amplifier 230, such increased current performs an ADD function.

In contrast, each programmed memory cell within the memory cell group 404 incrementally adds bit line current within bit line group 235. Depending upon the number of memory cells so-programmed, a factor of from 0 to 16 times the logic signal INPUT1 may be added to the bit line group 235 aggregate current. Since this bit line group 235 is coupled to the inverting input of sense amplifier 230, such increased current performs a SUBTRACT function.

Such a weighted logic block structure uses far fewer gates than implementations using more basic logic functions, such as AND, OR, INVERT, and XOR. For example, a parity tree grows linearly when implemented as weighted threshold logic, rather than growing as an $N^2$ polynomial. Moreover, the relative advantage of such a weighted threshold logic family grows with increasing numbers of input signals. The "cost" of this logic function may be measured as the number of crosspoints within each group, and very inexpensive crosspoint cells may be converted into a high logic computational power.

The weights of each input may be programmed into the non-volatile array, which may be implemented as a write-once antifuse memory array, or as a write-many (i.e., re-writable) device. While such an array is slow to program, and likely relatively slow in execution when compared to combinatorial logic, it has a great density advantage, particularly when the number of logic inputs is high.

The array structures described herein may also be utilized with memory cell structures other than passive element memory cells. For example, when an EEPROM memory cell technology is used, multiple program cycles may be used to adjust the threshold of a programmed memory cell until a desired magnitude of bit line current is achieved. Similarly, such memory cells may be programmed to achieve one of several desired magnitudes of bit line current, and thus can provide for storing more than one data bit within a group of cells, and can provide for an enhanced weighted threshold logic structure.

In the various descriptions herein, memory cells are frequently described as being individually programmed by selecting a single word line and single bit line, while during a read mode a group of word lines are configured to be logically identical so that more than one memory cell may contribute to bit line (or bit line group) current. It is also contemplated, however, that more than one memory cell may be programmed simultaneously in some embodiments of the present invention. For example, two memory cells which are associated with a given word line may be simultaneously programmed if two bit lines are simultaneously selected. Such two bit lines may be disposed within the same bit line group (i.e., for read mode) or may be disposed in different bit line groups.

As used herein, a "group" of objects may include a plurality of such objects, but need only include at least one, but not necessarily more than one. Moreover, an integrated circuit having a three-dimensional memory array is assumed to be a monolithic integrated circuit, rather than an assembly of more than one monolithic integrated circuit. The methods and apparatus of the present invention may also be used to advantage in monolithic three dimensional memories such as, for example, a three-dimensional, non-volatile, field-programmable memory array (both write-once and/or re-writable memory arrays). In such embodiments, the various word lines of a group of simultaneously selected word lines may be all located on the same layer of the array, or may be located on several different layers of word lines (i.e., associated with more than one memory plane of memory cells). Moreover, the methods and apparatus of the present invention may also be used to advantage in integrated circuits including two-dimensional arrays, and in many other non-memory integrated circuits.

Preferably, the memory cells are comprised of semiconductor materials, as described in U.S. Pat. No. 6,034,882 to Johnson et al., U.S. Pat. No. 5,835,396 to Zhang, U.S. Pat. No. 6,420,215 to Knall, and U.S. Pat. No. 6,515,888 to Johnson, et al., each of which are hereby incorporated by reference. Specifically an antifuse memory cell is preferred. Other types of memory arrays, such as MRAM and organic passive element arrays, can also be used. MRAM (magnetoresistive random access memory) is based on magnetic memory elements, such as a magnetic tunnel junction (MTJ). MRAM technology is described in "A 2556 kb 3.0V 1T1MTJ Nonvolatile Magnetoresistive RAM" by Peter K. Naji et al., published in the Digest of Technical Papers of the 2001 IEEE International Solid-State Circuits Conference, ISSCC 2001/Session 7/Technology Directions: Advanced Technologies/7.6, Feb. 6, 2001 and pages 94–95, 404–405 of ISSCC 2001 Visual Supplement, both of which are hereby incorporated by reference. Certain passive element memory cells incorporate layers of organic materials including at least one layer that has a diode-like characteristic conduction and at least one organic material that changes conductivity with the application of an electric field. U.S. Pat. No. 6,055,180 to Gudensen et al. describes organic passive element arrays and is also hereby incorporated by reference. Memory cells comprising materials such as phase-change materials and amorphous solids can also be used. See U.S. Pat. No. 5,751,012 to Wolstenholme et al. and U.S. Pat. No. 4,646,266 to Ovshinsky et al., both of which are hereby incorporated by reference.

The methods and apparatus of the present invention may also be used to advantage in other monolithic three dimensional memories, such as those described in Johnson et al., U.S. Pat. No. 6,034,882, "Vertically-Stacked, Field Programmable, Nonvolatile-Memory and Method of Fabrication"; Johnson, U.S. Pat. No. 6,525,953, "Vertically-Stacked, Field Programmable, Nonvolatile-Memory and Method of Fabrication"; Knall et al., U.S. Pat. No. 6,420,215, "Three Dimensional Memory Array and Method of Fabrication"; Lee et al., U.S. patent application Ser. No. 09/927,648, "Dense Arrays and Charge Storage Devices, and Methods for Making Same," filed Aug. 13, 2001; Herner et al., U.S. patent application Ser. No. 10/326,470, "An Improved Method for Making High Density Nonvolatile Memory," filed Dec. 19, 2002; Walker et al., U.S. patent application Ser. No. 10/335,089, "Method for Fabricating Programmable Memory Array Structures Incorporating Series-Connected Transistor Strings," filed Dec. 31, 2002; Scheuerlein et al., U.S. patent application Ser. No. 10/335,078, "Programmable Memory array Structure Incorporating Series-Connected Transistor Strings and Methods for Fabrication and Operation of Same," filed Dec. 31, 2002; Cleeves, U.S. patent application Ser. No. 10/185,508, "Three Dimensional Memory," filed Jun. 27, 2002; Kleveland, et al., U.S. patent application Ser. No. 09/897,705, "Three-Dimensional Memory Array Incorporating Serial Chain Diode Stack," filed Jun. 29, 2001; and Johnson, U.S. patent application Ser. No. 10/185,208, "Low-cost, Serially-Connected, Multi-Level Mask-Programmable Read-Only Memory," filed Jun. 27, 2002; all assigned to the assignee of the present invention and hereby incorporated by reference.

As used herein, a passive element memory array includes a plurality of 2-terminal memory cells, each connected between an associated X-line and an associated Y-line. Such a memory array may be a two-dimensional (planar) array or may be a three-dimensional array having more than one plane of memory cells. Each such memory cell has a non-linear conductivity in which the current in a reverse direction (i.e., from cathode to anode) is lower than the current in a forward direction. Application of a voltage from anode to cathode greater than a programming level changes the conductivity of the memory cell. The conductivity may decrease when the memory cell incorporates a fuse technology, or may increase when the memory cell incorporates an antifuse technology. A passive element memory array is not necessarily a one-time programmable (i.e., write once) memory array.

Such passive element memory cells may generally be viewed as having a current steering element directing current in a direction and another component which is capable of changing its state (e.g., a fuse, an antifuse, a capacitor, a resistive element, etc.). In certain preferred embodiments of the present invention, the memory element is a diode-like structure having a p+region separated from an n− region by an antifuse element. When the antifuse element is programmed, the p+region is electrically connected to the n− region and forms a diode. In an organic PEMA embodiment, the memory element is a diode-like structure having an anode region separated from a cathode region by an organic material layer whose conductivity changes as electrons are injected into the layer.

As used herein, a memory array does not necessarily imply a fully-decoded array configured to access data stored at each addressable location, although certain embodiments described herein do contemplate such a memory array. Rather, a memory array refers to an array of memory cells, even if the array is configured to implement a logic function quite unlike a fully decoded traditional memory array.

Word lines may also be referred to as row lines or X-lines, and bit lines may also be referred to as column lines or Y-lines. The distinction between "word" lines and "bit" lines may carry certain connotations to those skilled in the art. When reading a memory array, it is assumed by some practitioners that word lines are "driven" and bit lines are "sensed." Moreover, the memory organization (e.g., data bus width, number of bits simultaneously read during an operation, etc.) may have some association with viewing one set of the two array lines more aligned with data "bits" rather than data "words." Neither connotation is necessarily required in this description, although neither is inconsistent with at least some embodiments described.

The directionality of X-lines (e.g., which may be shown horizontally) and Y-lines (e.g., which may be shown vertically) is merely convenient for ease of description of the two groups of crossing lines in the array. While X-lines are usually orthogonal to Y-lines, such is not necessarily implied by such terminology.

Integrated circuits incorporating a memory array usually subdivide the array into a sometimes large number of smaller arrays, also sometimes known as sub-arrays. As used herein, an array is a contiguous group of memory cells having contiguous word and bit lines generally unbroken by decoders, drivers, sense amplifiers, and input/output circuits. An integrated circuit including a memory array may have one array, more than one array, or even a large number of arrays. An used herein, an integrated circuit memory array is a monolithic integrated circuit structure, rather than more than one integrated circuit device packaged together or in close proximity, or die-bonded together.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Although certain supporting circuits (e.g., decoders, sensing circuits, multiplexers, input/output buffers, etc.) are not specifically described, such circuits are well known, and no particular advantage is afforded by specific variations of such circuits in the context of practicing this invention. Moreover, it is believed that one of ordinary skill in the art, equipped with the teaching of this disclosure, will be able to carry out the invention, including implementing various control circuits inferred but not specifically described herein, using well known circuit techniques and without undue experimentation. Nonetheless, additional details of bias conditions, bias circuits, and layer decoder circuits particularly suitable for a three-dimensional memory array of write-once anti-fuse passive element memory cells are described in U.S. Pat. No. 6,618,295 to Roy E. Scheuerlein, entitled "Method and Apparatus for Biasing Selected and Unselcted-Array Lines When Writing A Memory Array", and in "Three-Dimensional Memory Array Incorporating Serial Chain Diode Stack" by Kleveland, et al, U.S. patent application Ser. No. 09/897,705, filed on Jun. 29, 2001, which are both hereby incorporated by reference in their entirety. Moreover, useful row and column circuits are described in "Multi-Headed Decoder Structure Utilizing Memory Array Line Driver with Dual Purpose Driver Device," U.S. patent application Ser. No. 10/306,887, filed Nov. 27, 2002, and in "Tree Decoder Structure Particularly Well Suited to Interfacing Array Lines Having Extremely Small Layout Pitch," U.S. patent application Ser. No. 10/306,888, filed Nov. 27, 2002, which applications are hereby incorporated by reference in their entirety.

The block diagrams herein may be described using the terminology of a single node connecting the blocks. Nonetheless, it should be appreciated that, when required by the context, such a "node" may actually represent a pair of nodes for conveying a differential signal, or may represent multiple separate wires (e.g., a bus) for carrying several related signals or for carrying a plurality of signals forming a digital word.

While circuits and physical structures are generally presumed, it is well recognized that in modem semiconductor design and fabrication, physical structures and circuits may be embodied in computer readable descriptive form suitable for use in subsequent design, test or fabrication activities as well as in resultant fabricated semiconductor integrated circuits. Accordingly, claims directed to traditional circuits or structures may, consistent with particular language thereof, read upon computer readable encodings and representations of same, whether embodied in media or combined with suitable reader facilities to allow fabrication, test, or design refinement of the corresponding circuits and/or structures. The invention is contemplated to include circuits, related methods or operation, related methods for making such circuits, and computer-readable medium encodings of such circuits and methods, all as described herein, and as defined in the appended claims. As used herein, a computer-readable medium includes at least disk, tape, or other magnetic, optical, semiconductor (e.g., flash memory cards, ROM), or electronic medium and a network, wireline, wireless or other communications medium. An encoding of a circuit may include circuit schematic information, physical layout information, behavioral simulation information, and/or may include any other encoding from which the circuit may be represented or communicated.

The foregoing detailed description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. Moreover, the embodiments described above are specifically contemplated to be used alone as well as in various combinations. It is only the following claims, including all equivalents, that are intended to define the scope of this invention. Accordingly, other embodiments, variations, and improvements not described herein are not necessarily excluded from the scope of the invention.

What is claimed is:

1. A non-volatile memory cell array comprising within a first array block a first plurality of X-lines configured to be individually selected in a write mode of operation and configured to be simultaneously selected in a read mode of operation, and each associated with a first Y-line group numbering at least one Y-line and also associated with a second Y-line group numbering at least one Y-line.

2. The memory array as recited in claim 1 wherein the first and second Y-line groups are simultaneously selectable in a read mode and, when so selected, are respectively coupled to true and complement inputs of a sense amplifier circuit.

3. The memory may as recited in claim 2 wherein the first and second Y-line groups each numbers only one Y-line.

4. The memory may as recited in claim 2 wherein the first and second Y-line groups each numbers more than one Y-line.

5. The memory array as recited in claim 2 further comprising a reference signal operably coupled to either the true or complement input of the sense amplifier, wherein the first and second Y-line groups each numbers more than one Y-line.

6. The memory array as recited in claim 5 wherein the reference signal comprises a reference current.

7. The memory array as recited in claim 1 wherein:
the first Y-line group includes more than one Y-line; and
each of the first Y-line group is configured to be simultaneously selected in a read mode of operation.

8. The memory array as recited in claim 1 wherein the memory array comprises passive element memory cells.

9. The memory array as recited in claim 8 wherein the memory array comprises anti-fuse memory cells.

10. The memory array as recited in claim 8 wherein the memory array comprises magnetoresistive memory cells.

11. The memory array as recited in claim 1 wherein the memory array comprises EEPROM memory cells.

12. The memory array as recited in claim 1 wherein the memory array comprises a two-dimensional memory array having one plane of memory cells.

13. The memory array as recited in claim 1 wherein the memory array comprises a three-dimensional memory array having more than one plane of memory cells.

14. The memory array as recited in claim 13 wherein the first plurality of X-lines comprises X-lines disposed on more than one layer of the memory array.

15. The memory array as recited in claim 13 wherein the first plurality of X-lines comprises X-lines disposed only on a single layer of the memory array.

16. The memory array as recited in claim 1 configured to perform threshold logic upon one or more inputs to the array.

17. The memory array as recited in claim 1 further comprising a second plurality of X-lines configured to be simultaneously selected in a read mode of operation and each associated with the first Y-line group.

18. The memory array as recited in claim 17 further comprising a third plurality of X-lines associated with the first Y-line group, said third plurality of X-lines being configured, in a read mode of operation, to be simultaneously selected at certain times when the first plurality of X-lines is not selected.

19. The memory array as recited in claim 18 further comprising:
a fourth plurality of X-lines associated with the first Y-line group, said fourth plurality of X-lines being configured, in a read mode of operation, to be simultaneously selected when the second plurality of X-lines is not selected;

wherein each Y-line of the second Y-line group is associated with the first, second, third, and fourth pluralities of X-lines.

20. The memory array as recited in claim 17 configured to perform threshold logic upon one or more inputs to the array.

21. The memory array as recited in claim 17 configured to perform weighted input threshold logic upon one or more inputs to the array.

22. The memory array as recited in claim 1 wherein X-lines comprise word lines.

23. The memory may as recited in claim 1 configured as a content addressable memory array.

24. The memory array as recited in claim 1 wherein:
   each of the first Y-line group is configured to be simultaneously selected in a read mode of operation; and
   each of the second Y-line group is configured to be simultaneously selected in a read mode of operation.

25. The memory array as recited in claim 1 embodied in computer readable descriptive form suitable for use in design, test or fabrication of an integrated circuit.

26. A method of operating a non-volatile memory array comprising:
   programming individual memory cells associated with a first X-line group of at least one X-line within a first array block and further associated with a first Y-line group of at least one Y-line within the first array block until a desired first aggregate memory cell read current is obtained when simultaneously selecting all the first group of X-lines and all the first group of Y-lines, at least one of the first X-line group and first Y-line group including more than one such X-line or Y-line, and each of the first X-line aroup associated with a second Y-line group numbering at least one Y-line; and
   reading the memory array by simultaneously selecting all the first group of X-lines and all the first group of Y-lines and generating a signal responsive to the first aggregate memory cell read current.

27. The method of claim 26 further comprising:
   programming individual memory cells associated with the first X-line group and further associated with the second Y-line group of at least one Y-line until a desired second aggregate memory cell read current is obtained when simultaneously selecting all the first group of X-lines and all the second group of Y-lines, which second aggregate memory cell current is greater than the first aggregate memory cell current; and
   reading the memory array by simultaneously selecting all the first group of X-lines and all the first and second groups of Y-lines and generating a signal responsive to the greater of the first and second aggregate memory cell read current.

28. The method of claim 27 wherein the memory array comprises write-once memory cells.

29. The method of claim 26 further comprising:
   programming more than one cell associated with an X-line by simultaneously activating at least two Y-lines.

30. The method of claim 29 wherein said at least two simultaneously activated Y-lines are associated with different Y-line groups.

31. The method of claim 26 wherein the memory array comprises passive element memory cells.

32. The method of claim 31 wherein the memory array comprises anti-fuse memory cells.

33. The method of claim 31 wherein the memory array comprises magnetoresistive memory cells.

34. The method of claim 26 wherein the memory array comprises EEPROM memory cells.

35. An integrated circuit comprising:
   a memory array including:
      a plurality of X-lines disposed on at least one layer of the memory array;
      a plurality of Y-lines disposed on at least one other layer of the memory array;
      a plurality of non-volatile memory cells, each coupled to an associated one of the plurality of X-lines and an associated one of the plurality of Y-lines;
   an X-line selection circuit for selecting within a first array block at least a first X-line group of at least two X-lines when in a read mode, and for selecting a lesser number of X-lines within at least the first X-line group when in a write mode; and
   a Y-line selection circuit for simultaneously selecting within the first array block in the read mode a first Y-line group of at least one Y-line and a second Y-line group of at least one Y-line, and for respectively coupling the selected first and second Y-line groups to respective first and second inputs of an associated sense amplifier circuit;
   wherein the associated sense amplifier circuit is responsive to an aggregate signal from memory cells associated with both the selected first X-line group and the selected first Y-line group, and responsive to an aggregate signal from memory cells associated with both the selected first X-line group and the selected second Y-line group.

36. The integrated circuit as recited in claim 35 further comprising a reference signal circuit operably coupled to the second input of the associated sense amplifier circuit.

37. The integrated circuit as recited in claim 35 wherein the first Y-line group and the second Y-line group each number but one Y-line.

38. The integrated circuit as recited in claim 35 wherein the associated sense amplifier circuit is configured to sense more than two levels of aggregate memory cell signal.

39. The integrated circuit as recited in claim 35 wherein:
   the X-line selection circuit is further configured for selecting, when in the read mode, a second X-line group of at least two X-lines simultaneously with selecting the first X-line group; and
   the associated sense amplifier circuit is responsive to an aggregate signal from memory cells associated with the selected first X-line group and the selected first Y-line group and memory cells associated with the selected second X-line group and the selected first Y-line group, and responsive further to an aggregate signal from memory cells associated with the selected first X-line group and the selected second Y-line group and memory cells associated with the selected second X-line group and the selected second Y-line group.

40. The integrated circuit as recited in claim 35 wherein:
   the X-line selection circuit is further configured for selecting, when in the read mode, a third X-line group of at least two X-lines when the first X-line group is not selected.

41. The integrated circuit as recited in claim 35 wherein the memory array comprises passive element memory cells.

42. The integrated circuit as recited in claim 41 wherein the memory array comprises anti-fuse memory cells.

43. The integrated circuit as recited in claim 35 wherein the memory array comprises EEPROM memory cells.

44. The integrated circuit as recited in claim 35 wherein the memory array comprises a three-dimensional memory array having more than one plane of memory cells disposed above a semiconductor substrate.

45. The integrated circuit as recited in claim 44 wherein the first X-line group comprises X-lines disposed on more than one layer of the memory array.

46. The integrated circuit as recited in claim 44 wherein the first X-line group comprises X-lines disposed only on a single layer of the memory array.

47. The integrated circuit as recited in claim 35 embodied in computer readable descriptive form suitable for use in design, test or fabrication of said integrated circuit.

48. An integrated circuit comprising:
a memory array including:
 a plurality of X-lines disposed on at least one layer of the memory array;
 a plurality of Y-lines disposed on at least one other layer of the memory array;
 a plurality of non-volatile memory cells, each coupled to an associated one of the plurality of X-lines and an associated one of the plurality of Y-lines;
means for programming individual memory cells associated with a first X-line group of at least one X-line within a first array block and further associated with a first Y-line group of at least one Y-line within the first array block until a desired aggregate memory cell read current is obtained when simultaneously selecting all the first group of X-lines and all the first group of Y-lines, at least one of the first X-line group and first Y-line group including more than one such X-line or Y-line, and each of the first X-line group associated with a second Y-line group numbering at least one Y-line; and
means for reading the memory array by simultaneously selecting all the first group of X-lines and all the first group of Y-lines and generating a signal responsive to the aggregate memory cell read signal conveyed on the first group of Y-lines.

49. The integrated circuit of claim 48 further comprising:
means for programming more than one cell associated with an X-line by simultaneously activating at least two Y-lines.

50. The integrated circuit of claim 49 wherein said at least two simultaneously activated Y-lines are associated with different Y-line groups.

51. The integrated circuit of claim 48 wherein the memory array comprises passive element memory cells.

52. The integrated circuit of clami 51 wherein the memory array comprises anti-fuse memory cells.

53. The integrated circuit of claim 48 wherein the memory array comprises EEPROM memory cells.

* * * * *

UNITED STATES PATENT AND TRADEMARK OFFICE
CERTIFICATE OF CORRECTION

| | |
|---|---|
| PATENT NO. | : 7,177,183 B2 |
| APPLICATION NO. | : 10/675212 |
| DATED | : February 13, 2007 |
| INVENTOR(S) | : Roy E. Scheuerlein et al. |

It is certified that error appears in the above-identified patent and that said Letters Patent is hereby corrected as shown below:

In claim 3, column 14, line 15: the word "may" should read -- array --.

In claim 4, column 14, line 17: the word "may" should read -- array --.

In claim 23, column 15, line 14: the word "may" should read -- array --.

In claim 26, column 14, line 35: the word "aroup" should read -- group --.

Signed and Sealed this

First Day of May, 2007

JON W. DUDAS
*Director of the United States Patent and Trademark Office*